United States Patent
Carlson et al.

(10) Patent No.: US 7,256,386 B2
(45) Date of Patent: Aug. 14, 2007

(54) FABRICATION OF LOW LEAKAGE-CURRENT BACKSIDE ILLUMINATED PHOTODIODES

(75) Inventors: Lars S. Carlson, Del Mar, CA (US); Shulai Zhao, Encinitas, CA (US); John Sheridan, San Diego, CA (US); Alan Mollet, Oceanside, CA (US)

(73) Assignee: Digirad Corporation, Poway, CA (US)

( * ) Notice: Subject to any disclaimer, the term of this patent is extended or adjusted under 35 U.S.C. 154(b) by 0 days.

(21) Appl. No.: 10/842,938

(22) Filed: May 10, 2004

(65) Prior Publication Data

US 2004/0206886 A1    Oct. 21, 2004

Related U.S. Application Data

(60) Continuation of application No. 10/295,285, filed on Nov. 15, 2002, now Pat. No. 6,734,416, which is a division of application No. 09/839,641, filed on Apr. 20, 2001, now Pat. No. 6,670,258.

(60) Provisional application No. 60/198,912, filed on Apr. 20, 2000.

(51) Int. Cl.
*H01L 31/00* (2006.01)
(52) U.S. Cl. .................... 250/214.1; 257/447
(58) Field of Classification Search ............ 250/214.1, 250/214 R; 438/58, 471; 257/447
See application file for complete search history.

(56) References Cited

U.S. PATENT DOCUMENTS

| | | | |
|---|---|---|---|
| 4,127,932 A | 12/1978 | Hartman et al. | 438/58 |
| 4,131,488 A | 12/1978 | Lesk et al. | 438/71 |
| 4,246,590 A * | 1/1981 | Thomas et al. | 257/439 |
| 4,612,408 A | 9/1986 | Moddel et al. | 136/244 |
| 4,774,557 A | 9/1988 | Kosonocky | |
| 4,857,980 A | 8/1989 | Hoeberechts | 257/436 |
| 4,936,653 A * | 6/1990 | Schemmel et al. | 359/580 |
| 5,059,787 A * | 10/1991 | Lou | 257/436 |

(Continued)

FOREIGN PATENT DOCUMENTS

| | | |
|---|---|---|
| DE | 198 38 430 | 3/2000 |
| JP | 56-150878 | 11/1981 |
| WO | 98/20561 | 5/1998 |
| WO | 01/82382 | 11/2001 |

OTHER PUBLICATIONS

Hartiti, et al., "Back Surface Field-Induced Gettering in Multicrysalline Silicon", *IEEE*, pp. 998-1001 (1991).

(Continued)

*Primary Examiner*—Thanh X. Luu
(74) *Attorney, Agent, or Firm*—Fish & Richardson P.C.

(57) ABSTRACT

Ultra-low leakage current backside-illuminated semiconductor photodiode arrays are fabricated using a method of formation of a transparent, conducting bias electrode layer that avoids high-temperature processing of the substrate after the wafer has been gettered. As a consequence, the component of the reverse-bias leakage current associated with strain, crystallographic defects or impurities introduced during elevated temperature processing subsequent to gettering can be kept extremely low. An optically transparent, conductive bias electrode layer, serving as both an optical window and an ohmic backside equipotential contact surface for the photodiodes, is fabricated by etching through the polysilicon gettering layer and a portion of the thickness of heavily-doped crystalline silicon layer formed within, and near the back of, the substrate during the gettering process.

1 Claim, 1 Drawing Sheet

U.S. PATENT DOCUMENTS

| | | | |
|---|---|---|---|
| 5,360,748 A | 11/1994 | Nadahara et al. | 438/476 |
| 5,424,222 A * | 6/1995 | Arndt | 438/57 |
| 5,563,431 A | 10/1996 | Ohmi et al. | 257/291 |
| 5,739,067 A | 4/1998 | DeBusk et al. | 438/618 |
| 5,923,071 A | 7/1999 | Saito | 257/458 |
| 5,997,713 A | 12/1999 | Beetz, Jr. et al. | 205/124 |
| 6,025,585 A | 2/2000 | Holland | 250/208.1 |
| 6,054,373 A * | 4/2000 | Tomita et al. | 438/476 |
| 6,204,506 B1 | 3/2001 | Akahori et al. | |
| 6,259,085 B1 | 7/2001 | Holland | 250/208.1 |
| 6,504,178 B2 | 1/2003 | Carlson et al. | 257/86 |
| 6,670,258 B2 | 12/2003 | Carlson et al. | 438/471 |
| 6,734,416 B2 | 5/2004 | Carlson et al. | 250/214.1 |
| 2002/0011639 A1 | 1/2002 | Carlson et al. | 257/443 |
| 2002/0020846 A1 | 2/2002 | Pi et al. | 257/88 |
| 2006/0157811 A1 | 7/2006 | Carlson et al. | |
| 2006/0175539 A1 | 8/2006 | Carlson et al. | |
| 2006/0175677 A1 | 8/2006 | Carlson et al. | |
| 2007/0012866 A1 | 1/2007 | Carlson et al. | |

OTHER PUBLICATIONS

Holland, "An IC-Compatible Detector Process", *IEEE Transactions on Nuclear Science*, 36(1):283-289 (Feb. 1989).

Holland, "Development of Low Noise, Back-Side Illuminated Silicon Photodiode Arrays" *IEEE Transactions on Nuclear Science*, 44(3):443-447 (Jun. 1997).

Holland, S., "Fabrication of Detectors and Transistors in High-Resistivity Silicon", *Nuclear Instruments & Methods in Physics Research, Section A (Accelerators, Spectrometers, Detectors and Associated Equipment)*, A275(3):537-541 (1989).

Patent Abstracts of Japan for Japanese Patent Application JP 56-15078, published Nov. 21, 1981, entitled: "Semiconductor Image Pickup Device".

* cited by examiner

FABRICATION OF LOW LEAKAGE-CURRENT BACKSIDE ILLUMINATED PHOTODIODES

CROSS-REFERENCE TO RELATED APPLICATION

This application is a continuation of U.S. application Ser. No. 10/295,285, filed Nov. 15, 2002, now U.S. Pat. No. 6,734,416 which is a divisional of U.S. application Ser. No. 09/839,641, filed Apr. 20, 2001, now U.S. Pat. No. 6,670,258 which claims benefit of U.S. provisional application Ser. No. 60/198,912, filed Apr. 20, 2000.

TECHNICAL FIELD

The present invention relates to electromagnetic radiation detectors, and more specifically to backside-illuminated semiconductor photodiode arrays.

BACKGROUND

A typical photodiode array includes a semiconductor substrate of a first conductivity type, having a front side formed with an array of doped regions of a second, opposite conductivity type, and an opposing back side that includes a heavily-doped bias electrode layer of the first conductivity type. For simplicity, the frontside doped regions are referred to below as gates, independent of their function as anodes or cathodes. Similarly, the abbreviation BEL is used to denote the backside bias electrode layer.

To provide a framework for the discussion below, an example of a photodiode array is used below in which the frontside doped gate regions have p-type conductivity, the substrate is n-type, and the backside bias electrode layer is, accordingly, a heavily-doped n-type layer. All statements and claims herein are equally true if the conductivity types of all the layers are reversed and the corresponding changes are made to the polarities of the charge carriers, applied voltages and electric fields.

Typically, the gate and bias electrode layers are formed internally to the crystalline semiconductor substrate. They are therefore native to and homostructural with the substrate. In most implementations, an external gate contact, formed from one or more non-native, heterostructural, conducting layers external to the substrate, is formed over a portion of each of the frontside gates. Similarly, one or more non-native, heterostructural, external back contacts may be formed over all, or a portion of, the backside bias electrode layer. In the case of silicon substrates, the gate contacts are usually formed from one or more metals, metal-silicon intermetallic compounds, or deposited, heavily-doped polysilicon, or a combination of a plurality of these materials. In the present context, polysilicon is considered to be both non-native and heterostructural to the crystalline silicon substrate. Similarly, silicon dioxide ($SiO_2$), the amorphous "native oxide" of silicon, is both non-native and heterostructural to the substrate in this context. Back contacts to silicon photodiode arrays may use the same materials or one or more transparent conducting materials such as indium-tin oxide, which is an amorphous typically non-stoichiometric mixture of indium oxide and tin oxide. In many applications, an array of readout circuits is also formed on the front surface of the substrate.

A potential difference, referred to as a reverse bias, can be applied between the gate and the bias electrode layer to produce a depletion region within the substrate extending into the substrate from the p-n junction between the gate on the front side and the substrate. Hence, a photodiode is effected by the gate, the substrate and the BEL. External gate contacts or back contacts are ancillary elements provided to facilitate electrical connections to the photodiode array, not essential components thereof.

Such a photodiode array may be configured either in a frontside-illuminated mode to receive photons from the front side or in a backside-illuminated mode to receive photons from the backside. The frontside-illuminated mode, however, usually results in a lower external quantum efficiency (ratio of photocarriers collected to incident photons) than the backside-illuminated mode, because the conducting elements of the gate contacts and the readout circuits (if provided) reduce the active photosensitive area of the array on the front side. In comparison, the entire back side can be used to collect incoming radiation when properly configured. All other factors being equal, enhanced photosensitivity results in increased signal-to-noise ratio. In single-particle radiation detection applications using either direct (intrinsic) detection in the substrate or indirect detection (e.g., using scintillators as discussed below), enhanced photosensitivity results in improved particle energy resolution. In addition, conducting lines and other physical features such as steps in dielectric thickness on the front side can scatter light into the photosensitive areas of adjacent photodiodes, thereby reducing image contrast. Contrast degradation modifies the modulation transfer function of the array and can reduce the useful spatial resolution of the array. Therefore, backside illuminated photodiode arrays are frequently used in imaging applications to improve photosensitivity, signal-to-noise ratio, particle energy resolution and spatial resolution.

In a backside-illuminated photodiode, photocurrent is typically generated by band-to-band absorption. Photons with energy greater than the bandgap of the semiconductor substrate enter the back of the substrate and are absorbed, producing electron-hole pairs. If an electron-hole pair is generated outside the depletion region of a gate, the minority carrier (a hole in the example above) may diffuse to the edge of the depletion region beneath one of the gates. The electric field within the depletion region "collects" the hole by accelerating it towards the gate. If, however, a photon is absorbed within the depletion region of a gate, the electric field "collects" the hole as above, but accelerates the electron towards the undepleted substrate, or, if the substrate is fully depleted below a gate, towards the backside bias electrode layer. In either case, the photocurrent will flow through the photodiode and the external circuitry that maintains the bias between the gate and the bias electrode layer. If readout circuitry is provided on same semiconductor substrate, the circuit elements associated with each gate will produce a signal that represents a mathematical function of the photocurrent, the quantity of charge caused by the photon absorption, or a combination of both.

In low light-level imaging applications such as night photography, nuclear medical imaging, photon medical imaging, x-ray computed tomography and ballistic photon detection, it is critical for photodiode arrays simultaneously to exhibit high external photon conversion efficiency (defined as the ratio of photocarriers collected to photons incident on the back surface of the substrate) and extremely low reverse-bias leakage currents. For brevity, "quantum efficiency" is used below to denote external photon conversion efficiency, and "leakage current" is used to denote reverse-bias leakage current.

In low light-level imaging systems, the input optical signal often is in the form of short pulses, a few nanoseconds to a few microseconds in duration. For these applications, it is highly beneficial for the photodiodes to have short pulse response times, often referred to collectively as transition times or, singly, as rise and fall times, in the rough order of magnitude range of 10 to 100 ns or less. The signal processing system associated with the photodiode arrays typically "shapes" the output pulse by integrating the photocurrent generated within a time window of fixed duration in the same order of magnitude as the length of the photopulse.

Photodiode arrays with one or more long transition times produce output photocurrent pulses significantly longer than the input photopulse. These long photocurrent pulses produce smaller output pulses from the signal processing electronics than do those from faster photodiode arrays. Therefore, slow photodiode arrays may result in low output signals from the signal processing electronics and therefore degrade the signal-to-noise ratio of the image. In applications with higher photon flux rates, e.g., x-ray computed tomography, the signal processing electronics may respond to the average photocurrent collected by a pixel over a time interval of fixed duration, longer than the duration of a single optical pulse. For these applications, longer transition times than those required for efficient single pulse detection may be acceptable.

To achieve high quantum efficiency, the bias electrode layer should be thin enough to be transparent to the incident radiation, yet sufficiently conductive to provide an equipotential surface on the back surface of the substrate adequate to maintain uniform depletion over the entire area beneath each gate.

The bias electrode layer should also have a low density of crystallographic defects and be free from deep-level impurities. If these criteria are met, the BEL will exhibit long enough minority-carrier lifetimes to minimize recombination of photocarriers generated within the BEL, thereby maximizing the efficiency of collection of photocarriers generated therein The BEL will therefore not be an optical "dead layer."

The pulse response times of the photodiodes can be minimized by using semiconductor substrates of high resistivity in the approximate range of 5 to 25 k$\Omega$-cm, operated under reverse bias conditions sufficient to fully deplete the substrate under the gates. Under such full-depletion conditions, the electric field of the depletion region extends to the bias electrode layer on the back side.

Achieving ultra-low leakage current densities, e.g., below about 1nA/cm$^2$ at room temperature, of the individual photodiodes requires reduction of the contributions to the total leakage current by (1) the substrate; (2) the back contact structure (including the bias electrode layer and any additional layers formed thereon); (3) the front surface regions between the gate regions and between the outer gates and the surrounding regions; and (4) the edges of the substrate, formed when the substrate is "diced" to form individual photodiode array chips.

The bulk generation current of the substrate may be reduced by "gettering," an elevated-temperature process, typically performed at 1000° C. or higher for silicon substrates, in which strained, damaged or heavily-doped layers, singly or in combination, on the back surface of the substrate attract and capture impurities or crystallographic defects. Crystallographic defects may also be annihilated by recombination during the gettering process. The strained, damaged or heavily-doped "gettering layer" or layers is subsequently removed, thereby removing the absorbed impurities and defects. Once the substrate has been gettered, further high-temperature processes should be avoided, to prevent introduction of new impurities or generation of additional defects. All subsequent chemical processing and handling of the substrate should be scrupulously clean to avoid re-contamination.

Front surface generation currents in silicon photodiode arrays are usually minimized by using silicon dioxide ($SiO_2$) layers thermally grown under conditions known to produce low-leakage surfaces. These oxides are typically grown prior to, or concurrently with, the gettering process. Low-temperature (below 400° C.) treatments may be performed after gettering to optimize surface leakage.

Minimizing leakage currents associated with the back contact structure requires dealing with a number of contradictory requirements. As discussed above, the bias electrode layer must be thin enough to be transparent. Such thin layers, however, are easily damaged, and damaged regions may generate leakage current very efficiently. Under fully depleted conditions, the bias electrode layer must be contain enough electrically active (i.e., charged as opposed to neutral) dopant atoms to allow it to terminate the electric field of the depletion region. The back surface of the crystalline semiconductor substrate, or the interface between the substrate and overlayers formed upon the back surface of the substrate to enhance the backside conductivity or to reduce reflection of incident photons, is a region where the crystal structure of the substrate is imperfectly terminated. Such regions may be capable of generating high leakage currents. If the electric field penetrates the BEL and reaches such an interface, it will efficiently collect the current generated there. Similarly, the electric field will collect leakage current generated by impurities or defects within the BEL. Undepleted regions in the BEL typically are highly-doped and will not be efficient leakage generators. Deep level impurities and defects in depleted regions of the BEL, on the other hand, may generate large leakage currents. If the BEL does not exhibit long minority carrier lifetimes, the BEL may therefore degrade the leakage current of the photodiodes.

Edge leakage currents are usually suppressed by providing guard structures surrounding the array of pixels. These structures collect the leakage currents generated at the diced edges before it reaches the pixels themselves.

SUMMARY

The present invention comprises fabrication of ultra-low leakage current backside-illuminated photodiode arrays wherein the transparent, conducting bias electrode layer is formed so high-temperature processing of the substrate is avoided after the wafer has been gettered. As a consequence, the component of the reverse-bias leakage current associated with strain, crystallographic defects or impurities introduced during elevated temperature processing subsequent to gettering can be kept extremely low. An optically transparent, conductive bias electrode layer, serving as both an optical window and a backside equipotential contact surface for the photodiodes, is fabricated by etching through the polysilicon gettering layer to a thin, heavily-doped crystalline silicon layer formed within the back of the substrate during the gettering process. As discussed above, a structure that simultaneously provides a transparent window and a conductive contact over the same area of the substrate, is important in the case of fully depleted photodiodes and photodiode arrays. An electrical contact formed only around the periphery of the pixel area(s) would not be able to conduct the reverse-bias leakage current generated in the interior of the pixel area. It would therefore be unable to maintain full depletion.

Photodiode arrays fabricated according to this method, and the bias electrode layers of these arrays, are mechanically, electrically and optically superior to the prior art. Bias electrode layers formed in accordance with this method are internal (native), monocrystalline, homostructural layers formed within the semiconductor substrate. The interface between the BEL and the adjoining high-resistivity substrate material does not terminate the crystalline lattice of the substrate, as is the case when the BEL is a polycrystalline layer or a thin metal layer. Interfaces produced by the present method are inherently superior to those produced when the BEL is formed by epitaxy; it is impossible to completely eliminate crystallographic defects and interfacial impurities at epitaxial interfaces.

Bias electrode layers formed according to the present invention have high minority carrier lifetimes. Photocarriers generated therein may be efficiently collected by the depletion regions beneath the gates. Therefore, these BELs can be far thicker than those fabricated using prior art. BEL thicknesses of rough order of magnitude 0.25 to 1.0 micrometer formed in silicon substrates exhibit high external quantum efficiency and low leakage currents. Such BELs are far less susceptible to damage than those with thicknesses of rough order of magnitude 0.01 micrometer formed using prior techniques.

DESCRIPTION OF DRAWINGS

These and other features and advantages of the invention will become more apparent upon reading the following detailed description and upon reference to the accompanying drawings.

DETAILED DESCRIPTION OF THE INVENTION

In one embodiment of the present invention, the heavily-doped polysilicon gettering layer is etched away at approximately room temperature after wafer gettering has been accomplished. This forms an internal (native), optically transparent, conductive, homostructural bias electrode layer from the crystalline layer, doped by dopant diffusion during the gettering process, that remains within the original substrate. The bias electrode layer thus formed provides a transparent, conductive, internal ohmic contact to the photodiode pixels. Part of the crystalline doped layer may be removed during this process to optimize the sheet resistivity of the contact layer.

Figure 1:
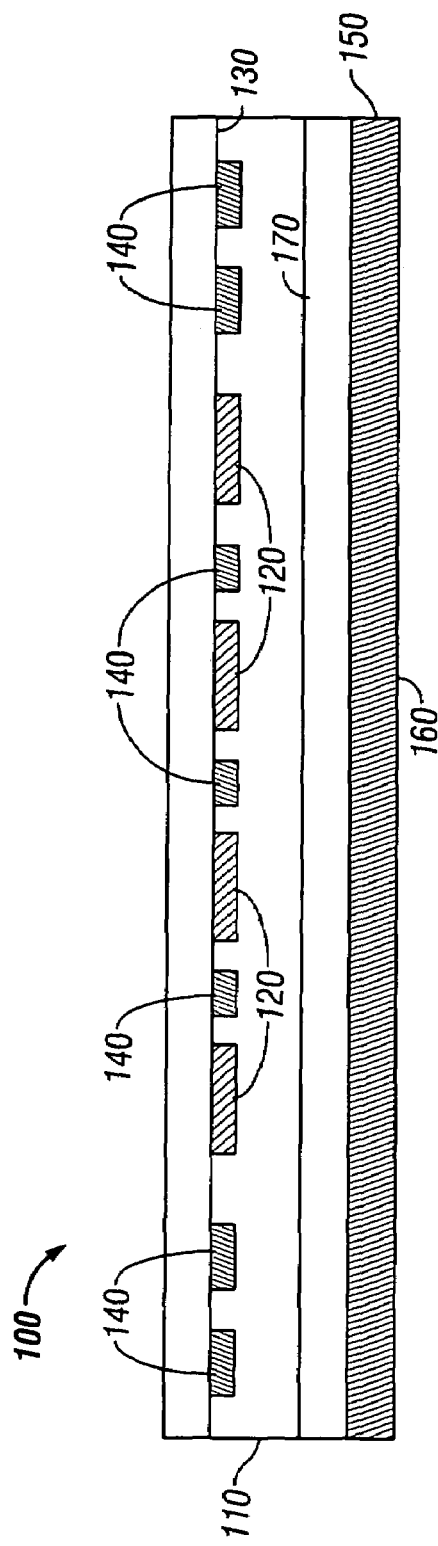
FIG. 1 illustrates a backside-illuminated photodiode structure prior to backside thinning according to one embodiment of the invention.

Referring to FIG. 1, the low-leakage current backside-illuminated photodiode array structure 100 is formed within a high-resistivity silicon substrate 110 of a first conductivity type. For illustrative purposes, the substrate may be taken to be n-type. Using conventional semiconductor processing techniques, an array of heavily-doped gate regions 120 of a second, opposite conductivity type, is formed near the front surface 130 of the substrate 110. Additional doped regions 140, each of which may have the same conductivity type as the substrate 110 or the opposite conductivity type, may be formed for purposes other than fabrication of the photodiode array itself.

Additional low- or high-temperature process (e.g., growth or deposition of oxides or other dielectric layers, chemical or plasma etching, dopant deposition, diffusion, ion implantation) may be performed as part of the process of defining the frontside structures of the photodiode array or ancillary devices.

Subsequent to the final high-temperature process, a polysilicon layer 150 is deposited on the back surface 160 of the substrate 110. The polysilicon layer 150 may have a thickness in the rough order of magnitude of 0.25 to 1.5 micrometers. The polysilicon layer 150 is heavily doped by incorporation of impurities of the same conductivity type as the substrate 110. Polysilicon doping may be performed in situ during deposition or subsequently by deposition of a dopant source layer (e.g., $POCl_3$ for n-type substrates) or other means. The photodiode structure 100 is then subjected to a high-temperature thermal gettering cycle to transport crystallographic defects and unintentional impurities into the doped polysilicon layer 150. During the gettering process, which may involve oxidation of the front or back surfaces of the photodiode structure 100, dopant atoms from the polysilicon layer 150 may diffuse into the back regions of the substrate 110, forming a heavily-doped internal (native), homostructural, crystalline layer 170 within the substrate 110. The backside diffused layer 170 may initially have a thickness of rough order of magnitude 0.5 to 5 micrometers, a maximum carrier concentration of rough order of magnitude $1\times10^{20}$ $cm^{-3}$, and a sheet resistivity of rough order of magnitude 2 to 20Ω per square.

Following the gettering process, the doped polysilicon layer 150 and part of the backside diffused layer 170 are removed. Removal of the polysilicon gettering layer 150 and the portion of the backside diffused layer 170 may be accomplished by wet-chemical etching, ion-assisted etching (plasma or reactive-ion etching) singly or in combination, or by other means.

The backside diffused layer 170 is thinned to a final thickness compatible with high external quantum efficiency, low leakage current, and conductivity adequate to facilitate uniform backside biasing. The backside diffused layer 170 may have a final thickness of rough order of magnitude range of 0.25 to 1.0 micrometers and a sheet resistivity in the approximate range of 50 to 1000 Ω per square.

Figure 2:
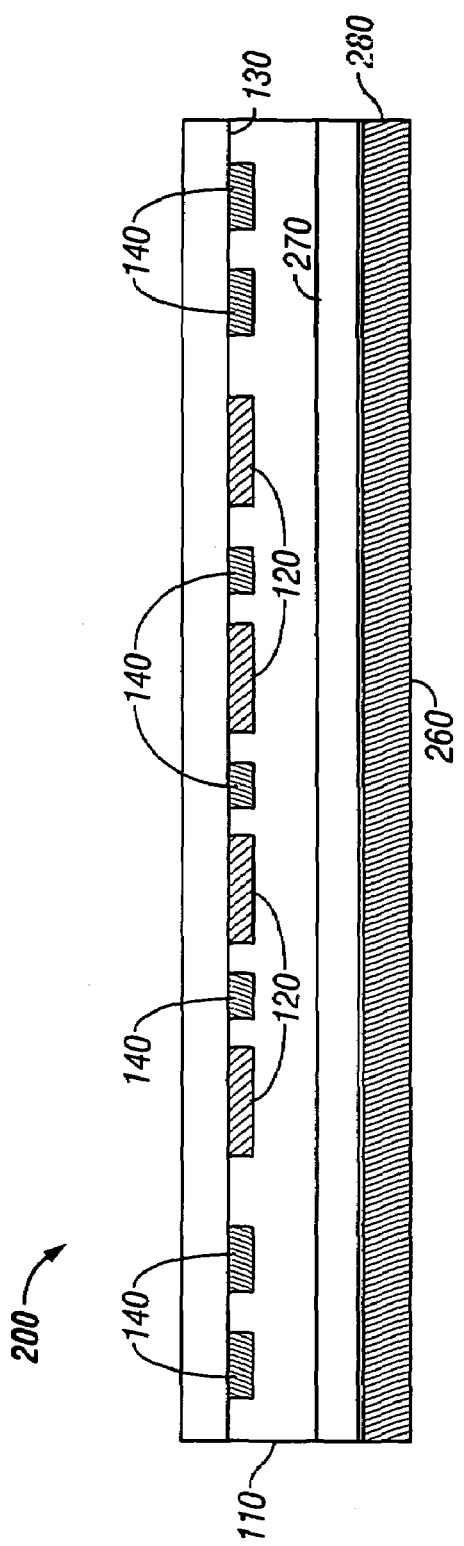
FIG. 2 illustrates a backside-thinned photodiode array structure according to one embodiment of the invention.

Referring to FIG. 2, the backside-thinned photodiode array structure 200 includes all the frontside layers, interfaces and other features as the unfinished photodiode structure 170 of FIG. 1. Additional layers, interfaces or features may be formed upon the front surface 130 of the substrate 110 prior to backside thinning, to provide external contacts to the gates 120 or additional doped layers 140, to provide readout circuits, or for other purposes. The backside-thinned photodiode array 200 includes a thinned backside diffused layer 270 that forms the bias electrode layer for the photodiode array structure. The thinning process also creates a new back surface 260 on the substrate 110.

Subsequent to backside thinning, one or more additional external (non-native) layers 280 may be formed over the new back surface 260 to decrease the reflectivity of the structure at the optical wavelengths of interest or to enhance the backside conductivity of the structure. In contrast to the ultra-thin backside contact structures employed in the prior art, the thick, robust bias electrode layers 270 of the backside-thinned structure 200 are sufficiently conductive to render such conductivity enhancement unnecessary. Therefore, a wide choice of single- or multi-layer dielectric anti-reflective coating structures may be used to optimize the external quantum efficiency of the photodiode array. Such optimization is not usually possible in the prior art, because there is a very limited selection of transparent conductive layers such as indium-tin oxide [ITO] that can be used to enhance the back surface conductivity. These materials, therefore, afford a similarly limited choice of optical properties to be used in designing conductive, anti-reflective coating structures. In general, photodiode arrays equipped with anti-reflection coating structures formed using transparent conductors will exhibit higher reflectivities than those using properly-designed dielectric anti-reflection coating structures.

The method described herein has been employed to fabricate 16-element (4×4 pixel square) silicon photodiode arrays with approximately 9 mm$^2$ (3 mm×3 mm) pixel areas used in a commercially available gamma-ray imaging system. These devices exhibit high external quantum efficiencies—over 90% at 560 nm wavelength—when equipped with single—or multi-layer dielectric anti-reflection coatings. Production devices routinely exhibit reverse-bias leakage currents below 1nA/cm$^{-2}$ at room temperature.

A number of embodiments of the invention have been described. Nevertheless, it will be understood that various modifications may be made without departing from the spirit and scope of the invention. Accordingly, other embodiments are within the scope of the following claims.

What is claimed is:

1. A diode, comprising:
   a single continuous piece, optically transparent semiconductor substrate, having a front surface and a rear surface, having-a portion with changed properties which forms a first region and a second region within said single continuous substrate, between which a crystalline lattice remains uninterrupted, said second region being a conductive region adapted for use in applying a bias thereto; and
   at least one structure of opposite conductivity type to a conductivity type of the semiconductor substrate, formed in said semiconductor substrate, adjacent a front surface thereof
      wherein said second region has a sheet resistivity between 2 and 20 Ω per square.

* * * * *